Figure 1:
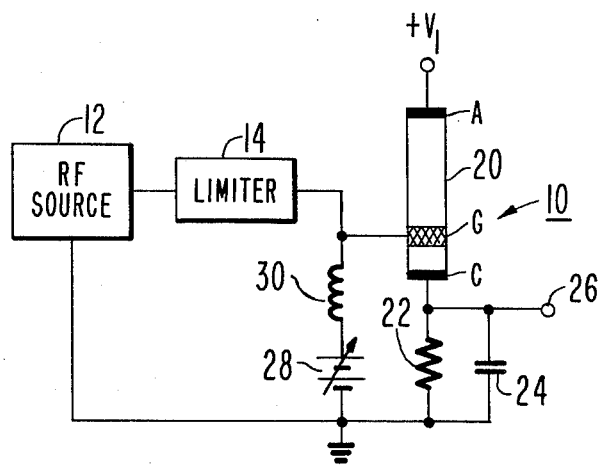

United States Patent

Sterzer

[11] 4,356,415
[45] Oct. 26, 1982

[54] FREQUENCY DISCRIMINATOR UTILIZING A TRANSFERRED ELECTRON DEVICE

[75] Inventor: Fred Sterzer, Princeton, N.J.

[73] Assignee: RCA Corporation, New York, N.Y.

[21] Appl. No.: 168,044

[22] Filed: Jul. 14, 1980

[51] Int. Cl.³ .................. H03D 3/26; H03K 17/56; H03K 17/04
[52] U.S. Cl. .................. 307/522; 307/519; 307/299 R; 329/103
[58] Field of Search ............ 307/522, 299 R, 519; 329/103

[56] References Cited

U.S. PATENT DOCUMENTS

| | | | |
|---|---|---|---|
| 2,915,636 | 12/1959 | Cluwen | 307/522 X |
| 3,991,328 | 11/1976 | Upadhyayula | 307/299 R |
| 4,000,415 | 12/1976 | Curtice | 307/299 R |
| 4,110,700 | 8/1978 | Rosen et al. | 329/103 |
| 4,158,784 | 6/1979 | Curtice | 307/299 R |

OTHER PUBLICATIONS

RCA Review, vol. 35, Mar. 1973, pp. 152-163, "Info. Processing with TED" by F. Sterzer.
Proc. IEEE, vol. 60, Feb. 1972, p. 235, "Logic and Memory App. of the Schottky-Gate Gunn-Effect Digital Device" by Sugeta.

*Primary Examiner*—John S. Heyman
*Attorney, Agent, or Firm*—S. Cohen; R. L. Troike; R. E. Smiley

[57] ABSTRACT

A three terminal transferred electron device (TED) with a Schottky barrier gate and a series connected output circuit are connected to a bias supply which biases the TED just below threshold. A radio frequency (RF) signal of a given peak amplitude is applied to the TED gate which is biased such that the negative peak of each cycle of RF signal nucleates the domain in the TED. The resulting change in signal over a given time period at the output circuit is a measure of RF signal frequency.

4 Claims, 3 Drawing Figures

FREQUENCY DISCRIMINATOR UTILIZING A TRANSFERRED ELECTRON DEVICE

This invention is concerned with a frequency discriminator and more particularly a frequency discriminator utilizing a transferred electron device.

There are frequency discriminator circuits presently available for producing a voltage amplitude signal or current signal corresponding to the frequency of an input signal. Presently available frequency discriminators for use at gigahertz frequencies are relatively complex and expensive.

In accordance with a preferred embodiment of the instant invention, a frequency discriminator circuit responsive to an input radio frequency signal of a given amplitude for producing an output signal having a value representative of the frequency comprises, in combination, a three terminal transferred electron device (TED) having an anode terminal and a cathode terminal and a gate terminal to which is applied the input signal, an output circuit coupled in series with the TED and a biasing means coupled to the TED anode, cathode and gate terminals for biasing the TED such that nucleation occurs in the TED only in response to the peak in one sense of each input frequency cycle whereby the signal appearing at the output circuit is a measure of input frequency.

Figure 2:
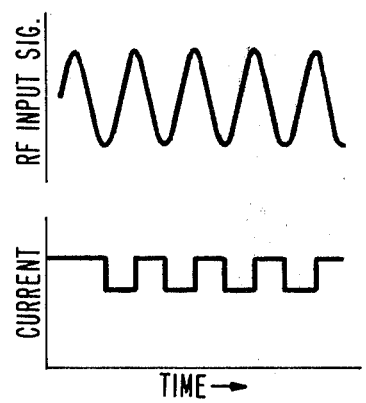
Figure 3:
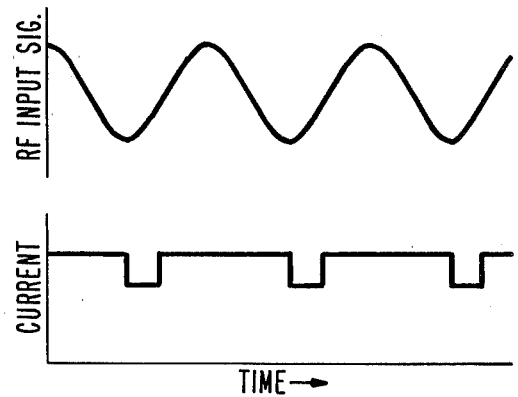

In the drawing:

FIG. 1 is a frequency discriminator circuit in schematic form in accordance with a preferred embodiment of the invention; and FIGS. 2 and 3 are waveforms useful in understanding the operation of the circuit of FIG. 1.

In FIG. 1, a frequency discriminator 10 receives a radio frequency (RF) input signal of unknown value, which may be in the gigahertz frequency range, from a suitable source 12 which is coupled to a limiter 14. Limiter 14 is typically a GaAs FET (gallium arsenide field effect transistor) limiter which limits the peak of the RF signal to a given value at or below the minimum expected amplitude of signal from source 12. Limiter 14 is coupled to the gate terminal (G) of a three terminal transferred electron device (TED) 20. TED 20 is preferably of the type described in detail in F. Sterzer, "Information Processing with Transferred Electron Devices," *RCA Review*, p. 152, March 1973 in particular as illustrated in FIGS. 2a, 2b, 2c, and 3 thereof.

Other examples of suitable TEDs are described in U.S. Pat. No. 3,959,807 of L. C. Upadhyayula et al. and 3,991,328 to L. C. Upadhyayula and are incorporated herein by reference.

TED 20, as described in the Sterzer article has, in addition to a Schottky barrier gate G, an anode terminal (A) and a cathode terminal (C). A bias supply +V1 referenced to circuit ground is applied to the anode of TED 20. One end of an output circuit comprising the parallel combination of a resistor 22 and a smoothing capacitor 24 is connected to the terminal C of TED 20 and an output terminal 26. The other end of the parallel combination is connected to circuit ground. A gate bias supply comprising an adjustable source of DC potential 28 and series coupled RF choke 30 are connected between the gate terminal of TED 20 and circuit ground.

As known to those skilled in the art and as described in the aforementioned Sterzer article, given proper bias conditions, a TED nucleates a domain at its cathode. The domain matures and travels to its anode where it is collected at which time a new domain is nucleated at the cathode. Two domains cannot be present simultaneously in the TED. The transmit time of a domain from cathode to anode is a function of the TED geometry and doping and can be accurately set. In particular, for operation of discriminator 10, to be hereinafter described, the length of TED 20 is chosen such that the domain transit time meets two constraints. First, it must be no longer than the period of the highest expected frequency from source 12 so that a domain caused by one cycle of an input signal terminates before a succeeding cycle of input signal causes a succeeding domain to form. Second, it must be longer than the portion of each cycle of input signal which is of sufficient magnitude to cause nucleation in TED 20. A TED passes relatively high current when no domain is present and a relatively low current when a domain is present.

The current passes through resistor 22 causing a voltage thereacross which varies in a like manner. The value of +V1 is chosen so that TED 20 is biased slightly below threshold such that in the absence of signal from source 12 no domain formation occurs. Then the bias supply for gate G is set for example, such that a relatively negative portion of a desired value of input signal from source 12 at gate G will trigger the TED to domain formation. Relative to the resistance value R of the TED 20 when no domain is present, the value of resistor 22 is typically low, such as 0.2R. The value of bias $V_1$ relative to ground may be about 4.25 volts d-c for a typical 3.5 volt threshold TED 20. A positive DC potential of 0.75 volts is provided via choke 30 to the gate G to bias the TED 20 just below threshold. The negative going a-c input signal from source 12 causes the TED 20 to be above the threshold region and provide a rapid drop in current.

The value of capacitor 24 relative to resistor 22 is selected to integrate the current output from the TED 20 over a time period to provide an average voltage across resistor 22 which linearly decreases with increasing RF input frequency from source 12; i.e., the higher the frequency the more often the TED is above threshold and thus producing a decrease in current such that the average current decreases.

In operation, bias potential 28 is such that only the relatively negative peak of each cycle from limiter 14 cause nucleation of domains in TED 20. That is, the negative peak of each cycle of the RF signal passed by limiter 14, causes nucleation of a domain from a cathode of TED 20 and only one domain occurs for each negative cycle.

As each domain is nucleated the resistance of TED 20 increases causing the current through the TED to decrease. Because of the increased resistance in TED 20, the voltage across TED 20 increases while that across resistor 22 decreases. If the value of resistor 22 were chosen to be high relative to that of TED 20 the increase in voltage across TED 20 caused by the nucleation of a domain would be such that the TED would be above threshold and continued domain formation would occur. This memory action is described in the literature. For example, see T. Sugeta and H. Yanai, "Logic and Memory Applications of the Schottky-Gate Gunn-Effect Digital Device," *Proc. IEEE*, Vol. 60, p. 238, February 1972. However as previously mentioned, because the value of resistor 22 is chosen to be low relative to that of TED 20 no memory action occurs and only one nucleation of TED 20 occurs per cycle of input signal. Thus, the number of domains traversing the TED per second, will equal the RF frequency of the incoming RF signal from source 12.

FIGS. 2 and 3 show the current through TED 20 for two different RF input signals of two different frequencies. FIG. 2 illustrates a relatively high frequency and FIG. 3 illustrates a relatively low input frequency. From a review of FIGS. 2 and 3, it will be noted that the average current through TED 20 decreases linearly with increasing frequency. Therefore, the average voltage developed across load resistor 22, also linearly decreases with increasing input RF frequency. Thus, the circuit of FIG. 1, acts as a linear discriminator capable of operating at microwave frequencies and produces an output voltage at output terminal 26 which is inversely proportional to the frequency produced by source 12.

What is claimed is:

1. A frequency discriminator circuit responsive to an input radio frequency signal of a given amplitude for producing an output signal having a value representative of the frequency of the input signal comprising, in combination:

a three terminal transferred electron device (TED) having an anode terminal, a cathode terminal, and a gate terminal;

an output circuit coupled in series with said TED;

means for applying said input signal to said gate terminal; and means coupled to said anode, cathode and gate terminals for biasing said TED such that nucleation occurs in the TED only in response to the peak in one sense of each cycle of input signal at said gate terminal whereby the signal appearing at the output circuit is a measure of input frequency.

2. The combination as set forth in claim 1, further including a limiter coupled to said gate terminal and receptive of said input signal for limiting the amplitude of said input signal.

3. The combination as set forth in claim 1, wherein said output circuit comprises the parallel combination of a resistor and capacitor.

4. The combination as set forth in claim 1, wherein said biasing means includes a gate bias supply coupled to the gate of said TED and adjusted such that only the peak of each of said input signals of said given value causes nucleation of a domain in said TED.

* * * * *